United States Patent [19]
Lichtblau

[11] 4,021,705
[45] May 3, 1977

[54] RESONANT TAG CIRCUITS HAVING ONE OR MORE FUSIBLE LINKS

[76] Inventor: George Jay Lichtblau, 106 W. Wooster St., Danbury, Conn. 06810

[22] Filed: Mar. 24, 1975

[21] Appl. No.: 561,085

[52] U.S. Cl. .................................. 361/402; 340/280
[51] Int. Cl.² ........................................ H05K 1/04
[58] Field of Search ............. 317/101 A; 340/280, 340/258 R, 152 T; 343/6.5 SS; 336/200

[56] References Cited
UNITED STATES PATENTS

| 2,718,623 | 9/1955 | Yoder et al. ............... | 336/200 |
| 3,810,147 | 5/1974 | Lichtblau .................. | 340/280 |
| 3,909,726 | 9/1975 | Dobrovolny et al. ........ | 357/75 |

Primary Examiner—David Smith, Jr.
Attorney, Agent, or Firm—Weingarten, Maxham & Schurgin

[57] ABSTRACT

A planar resonant tag circuit especially useful in electronic security systems wherein the value of a circuit component can be electrically and selectively altered by one or more fusible links integrally formed with the planar circuit. At least one fusible link is formed in bridging relationship with one or more turns of a planar inductor and which can be selectively fused by application of an energizing field to activate the resonant circuit or to alter the resonant characteristics of the circuit.

12 Claims, 16 Drawing Figures

RESONANT TAG CIRCUITS HAVING ONE OR MORE FUSIBLE LINKS

FIELD OF THE INVENTION

This invention relates to electronic security systems for sensing the presence of a resonant tag circuit in an area under protection and more particularly to resonant tag circuits, the resonant characteristics of which can be electrically altered.

BACKGROUND OF THE INVENTION

Electronic security systems are known in which a resonant circuit is electromagnetically interrogated, the presence of such resonant circuit within a predetermined area under protection being indicative of an alarm condition. Such systems are employed, for example, for pilferage control in retail stores, libraries and the like wherein the resonant circuit is affixed to items being protected, such that unauthorized removal of an item from a protected area will occasion an alarm. A preferred system is the subject of U.S. Pat. Nos. 3,810,147 and 3,863,244 of the same inventor as herein in which a resonant tag circuit is operative at two frequencies, a first frequency for sensing tag presence and a second frequency for deactivation of the circuit by altering or destroying its resonant properties at the first or detection frequency. Deactivation of the tag circuit is accomplished by applying an electromagnetic field to the circuit of a strength sufficient to fuse a conductive link therein to alter the resonance characteristics of the circuit at its detection frequency by disconnection of a portion of the circuit.

In the resonant tag circuits of the aforesaid patents, the fusible link can be placed such that upon destruction of the link the tag becomes wholly inoperative or alternatively at a position within the tag circuit such that upon destruction of the link, the resonant properties of the tag at the detection frequency only are destroyed by disconnection of part of the overall circuit. As a further alternative, the link can be so placed that its destruction can give rise to a third resonant frequency different from both the detection and destruction frequencies of the tag circuit. It is the object of this invention to provide planar resonant tag circuits of the type shown in the aforesaid patents but constructed to include an electrically alterable inductor such that the circuit can be wholly inoperative until electrically activated or which can be electrically altered by variation of circuit inductance to provide different resonant characteristics.

SUMMARY OF THE INVENTION

According to the invention, planar resonant tag circuits are provided which are especially useful in electronic security systems wherein one or more fusible links are integrally formed with the planar circuits to alter the value of circuit inductance thereby to activate or render the circuits resonantly operative or to alter the resonant characteristics thereof. The novel planar resonant tag circuits include at least one fusible link integrally formed with the circuit and which bridges one or more turns of a planar inductor of the tag circuits. The provision of a shorted turn inductor in the resonant tag circuit provides a circuit which can be variously employed in many different operative modes in accordance with the requirements of systems in which or with which the tag circuits are to be employed. According to one embodiment of the invention, a resonant tag circuit can be constructed which is inoperative until electrically activated by destruction of a fusible link therein. In a second embodiment, a fusible link can be incorporated in a resonant tag circuit to short circuit a selected number of turns of an inductor therein to provide a first resonant frequency with the fusible link intact, and to provide alteration of the resonant frequency upon destruction of the link by increasing the Q of the inductor and thereby reducing its natural frequency. An inductive loop having a fusible link associated therewith can be conductively connected directly within the resonant circuit or may alternatively be inductively coupled to the circuit by mutual induction.

DESCRIPTION OF THE DRAWING

The invention will be more fully understood from the following detailed description taken in conjunction with the accompanying drawing in which.

DETAILED DESCRIPTION OF THE INVENTION

Figure 1:
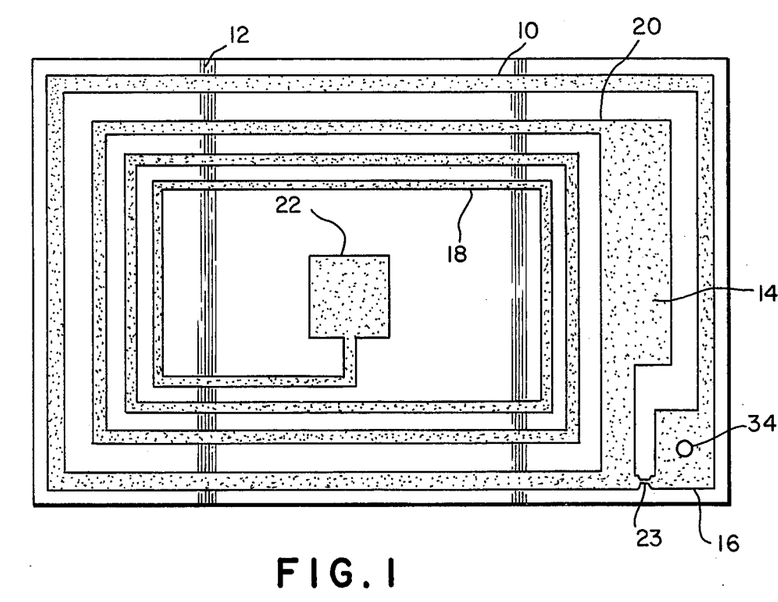
FIG. 1 is a pictorial representation of one side of a planar resonant tag circuit embodying the invention.

A multifrequency resonant circuit embodied on a card or tag adapted to be affixed to items of merchandise and the like is illustrated in FIG. 1 and is of the type shown and described in the aforesaid U.S. Pat. No. 3,863,244. The circuit is formed by printed or etched circuit techniques and includes a first conductive path 10 arranged in a generally rectangular path on a surface of an insulative substrate 12 and terminating at one end in a conductive area 14 disposed in adjacent spaced relationship near one edge of substrate 12. The other end of path 10 terminates at conductive area 16 disposed near one corner of substrate 12. A second conductive path 18 is formed as a rectangular spiral on substrate 12 and terminates at its outer end at a junction 20 with area 14, and at its inner end at a conductive area 22 disposed centrally of the spiral. A conductive path 23 interconnects area 14 and area 16 and is dimensioned to fuse upon flow therethrough of a predetermined current produced upon energization of the circuit by an applied energizing field.

Figure 2:
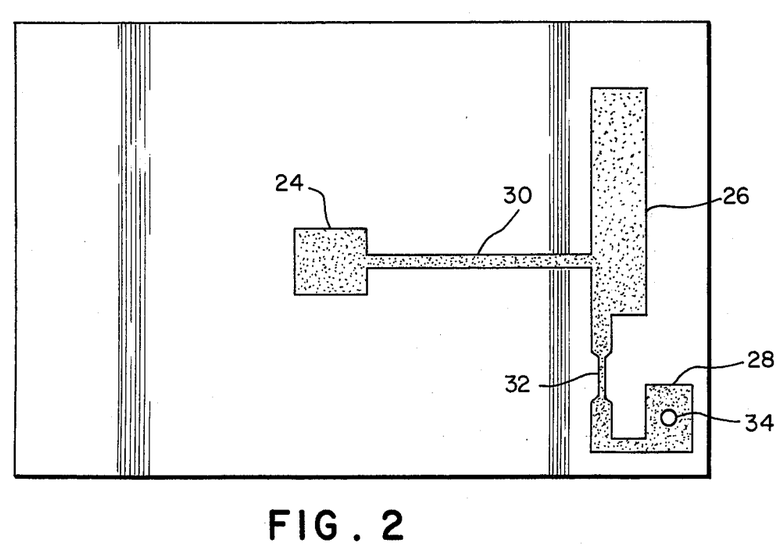
FIG. 2 is a pictorial representation of the opposite side of the planar circuit of FIG. 1.

The opposite surface of substrate 12 is illustrated in FIG. 2 and includes a conductive area 24 in alignment and generally coextensive with conductive area 22 on the substrate surface depicted in FIG. 1 and a pair of conductive areas 26 and 28 in alignment and generally coextensive with areas 14 and 16 on the other surface. The conductive areas 24 and 26 are interconnected with a conductive path 30, while the conductive areas 26 and 28 are interconnected by a conductive path 32. As will be further described hereinbelow, path 32 is dimensioned to fuse upon energization by a predetermined electromagnetic field to alter the resonant properties of the tag circuit. Electrical connection is made between areas 16 and 28 by means of a conductive pin 34 or the like extending through the substrate 12.

The conductive paths 10 and 18 serve as respective inductors of the resonant circuit and these paths are wound to provide either a positive or negative mutual coupling coefficient (M) between the inductors. The conductive areas 22 and 24 spaced by the interposed substrate 12 serve as a first capacitor, while a second capacitor is formed by the conductive area 14 cooperative with path 26 on the opposite substrate surface. The equivalent electrical circuit of the tag is illustrated in schematic form in FIG. 3 and exhibits two resonant frequencies, one employed for detection of tag presence and the other for alteration or destruction of tag resonance at the detection frequency. The inductor L1 is the outer loop 10, while the inductor 12 is in the inner loop 18. Capacitor C2 is formed by conductive areas 22 and 24, while capacitor C1 is formed by conductive areas 14 and 26.

Figure 3:
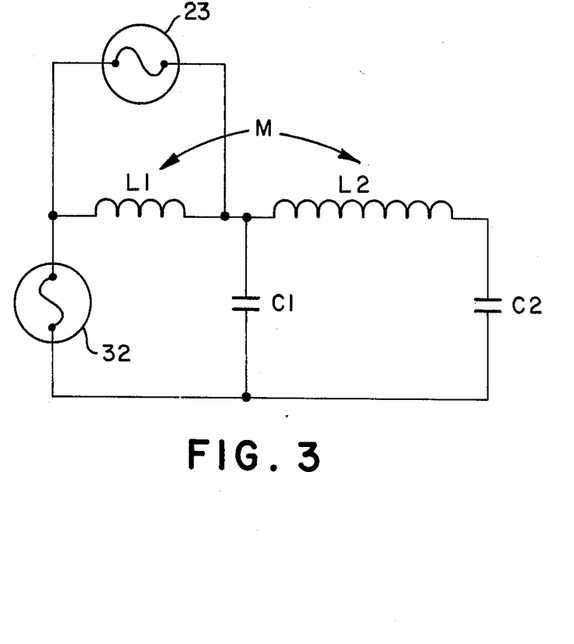
FIG. 3 is a schematic representation of the circuit of FIGS. 1 and 2.

The two loops in series, composed of inductors L1, L2, and capacitor C2, are tuned to a detection frequency which may be in any convenient portion of the spectrum. Typically, a detection frequency of 5 MHz is employed. The loop, composed of inductor L1 and capacitor C1, is tuned to a destruction frequency which preferably is one of the frequencies allocated by the FCC for industrial, scientific, and medical purposes known as the ISM frequencies. These ISM frequencies offer the advantage of unlimited radiated power and with no requirement for an operator's license. The ISM frequencies are 13.56, 27.12, 40.00 and 905 MHz, and in the illustrated embodiment a frequency of 27.12 MHz is employed.

It will be appreciated that the fusible path or link 23 short circuits inductor L1 thereby lowering the Q of the circuit and increasing its resonant frequency. The fusible link 32 is part of the resonant circuit loop composed of inductor L1 and capacitor C1 and is operative to fuse upon application of an energizing field at the destruction frequency of the tag circuit such that the tag is no longer sensible at its detection frequency. With the fusible link 23 intact, the circuit is inoperative at its destruction and detection frequencies and exhibits a different resonant frequency. The link 23 can be fused by application of an energizing field at the different or enabling frequency to cause inducement of sufficient current flow through link 23 to cause its destruction. The enabling frequency is selected to be sufficiently different than the destruction and detection frequencies of the circuit such that no significant current is caused to flow through link 32 upon application of an enabling field. After fusing of link 23, the circuit is operative in the manner described in the aforesaid U.S. Pat. No. 3,863,244 wherein, with link 32 present, the circuit is resonant at its detection frequency whereas the detection frequency is eliminated by fusing of link 32 upon application of an energizing field at the destruction frequency of the circuit.

For proper operation in an electronic security system such as that shown in the aforesaid patents, link 23 must be fused before fusing of link 32 in order to have two resonant frequencies for detection and deactivation purposes. Link 23 is preferably fused by the application of a low frequency high amplitude magnetic field, or a pulsed magnetic field. At low frequencies, the impedance of capacitor C1 limits the current in the path containing inductor L1, capacitor C1 and fuse 32, thus preventing burnout of fuse 32. Current can also be induced in the novel tag circuits by application of an electromagnetic field as in the aforesaid patents. Such electromagnetic field is applied at the resonant frequency of the circuit loop containing the link to be fused. If both fusible links are present in a common current path, as in FIG. 3, the links should be dimensioned such that the intended link will fuse. In the circuit of FIG. 3, link 23 is configured to be weaker than link 32 in order to fuse upon application of an energizing field.

Figure 4:
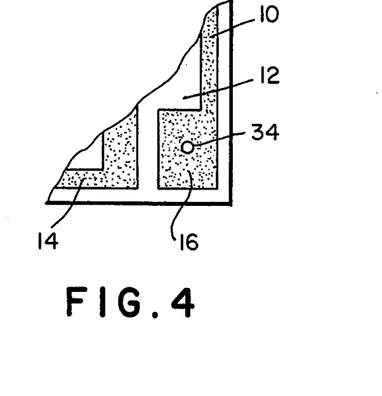
FIG. 4 is a cutaway pictorial representation of a modified version of the circuit of FIG. 1.
Figure 5:
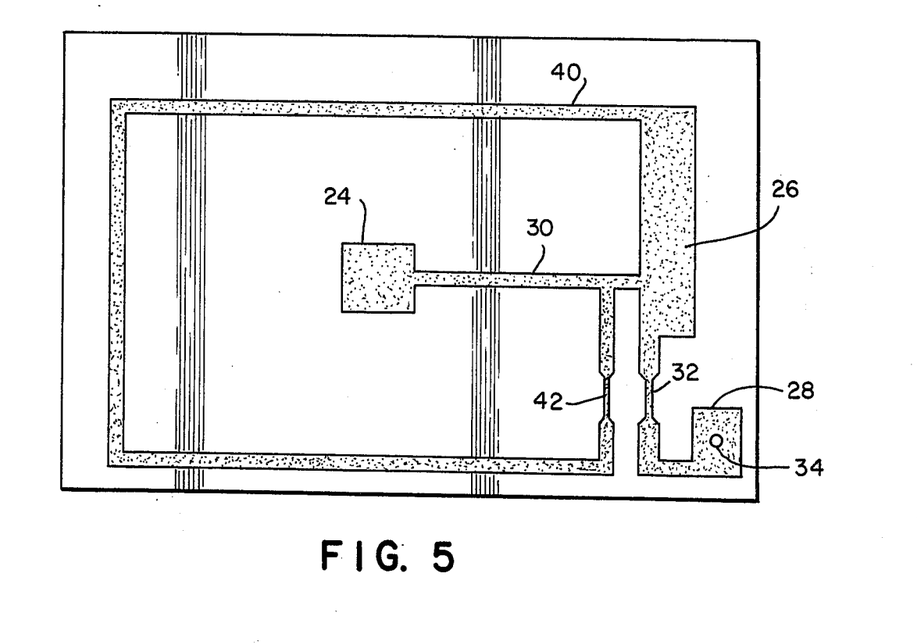
FIG. 5 is a pictorial representation of the opposite side of the circuit of FIG. 4.
Figure 6:
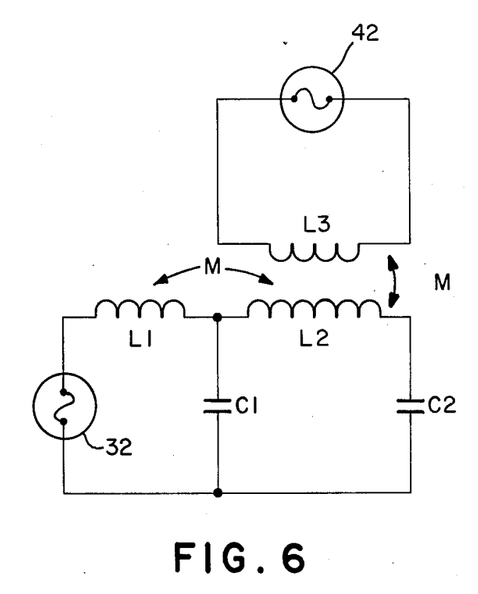
FIG. 6 is a schematic representation of the circuit of FIGS. 4 and 5.

An alternative embodiment of the novel resonant tag circuit according to the invention is shown in FIGS. 4 and 5 and the schematic circuit of which is shown in FIG. 6. In this embodiment both fusible links are formed on the same side of the planar circuit. The side of the planar circuit shown in FIG. 4 is the same as the circuit of FIG. 1 except that fusible link 23 is absent. The opposite side of the planar circuit depicted in FIG. 5 is similar to the corresponding circuit of FIG. 2 but in addition includes a conductive loop 40 coupled between path 26 and path 30 and including a fusible link portion 42. The conductive loop 40 comprises an inductor L3 having fusible link 42 in short circuit therewith as seen in the schematic of FIG. 6. The inductor L3 is magnetically coupled to inductors L1 and L2 and the operation of the circuit of FIGS. 4 through 6 is operationally equivalent to that of FIGS. 1-3. The circuit shown in FIGS. 4-6 offers a constructional advantage in that the loop 10 comprising inductor L1 can be formed of relatively thick metal to provide a relatively low loop resistance and a correspondingly high circuit Q. the fusible link 32 should preferably have relatively small cross-section for ready destruction by an applied fusing current. The fusible link 42 formed on the opposite surface to that containing inductor L1 can be formed to have the desired fusing properties without affecting the intended resistive properties of inductor L1.

Figure 7:
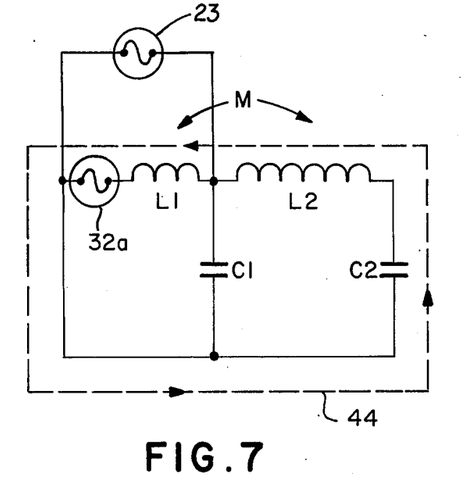
FIGS. 7 and 8 are schematic representations of alternative embodiments of the invention.

An alternative embodiment to the circuit of FIG. 3 is shown in FIG. 7 wherein the fusible link 32a is in the circuit leg containing inductor L1 and link 23 short circuiting capacitor C1. With links 23 and 32a intact, the circuit initially resonates with current flowing through the outer loop which includes capacitor C2, inductor L2 and link 23, as shown by dotted arrow 44. Little current flows through link 32a by reason of the reactance of inductor L1 which is higher than the resistance of that leg. The initial resonant frequency is determined by inductor L2 and capacitor C2 and associated mutual coupling to inductor L1. The current induced to fuse link 23 are line 32a flows only through the respective link and thus each link can be formed to fuse in response to a selected applied field irrespective of the characteristics of the other.

Figure 8:
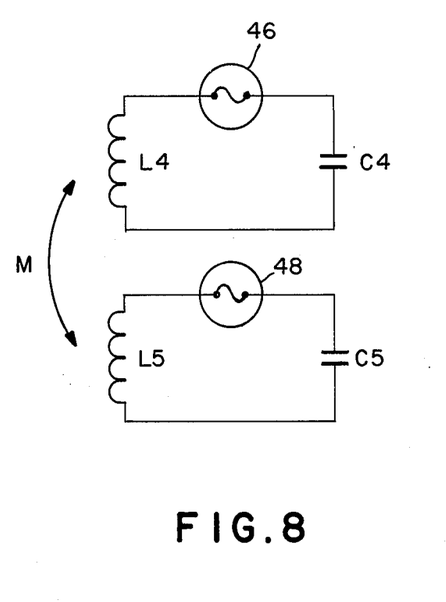

Referring to FIG. 8 there is shown a further circuit variation in which respective tuned circuits have no conductive electrical connection therebetween. The tuned circuit comprising capacitor C4 and inductor L4 is mutually coupled to the tuned circuit comprising capacitor C5 and inductor L5. Each circuit includes a respective fusible link 46 and 48. The circuits are overcoupled and stagger-tuned to provide an initial response to a swept frequency which is of double hump configuration. On deactivating either circuit by fusing the corresponding link 46 or 48, the remaining active circuit will resonate at a shifted frequency and this active circuit can in turn be deactivated by application of an appropriate energizing field thereto. Current flow through either link does not affect current flow through the other; that is, the links are not electrically in series and thus can be separately constructed to fuse upon application of a predetermined field without affect on the other link. As a result, the circuit can be selectively deactivated in a predetermined intended order.

Figure 9:
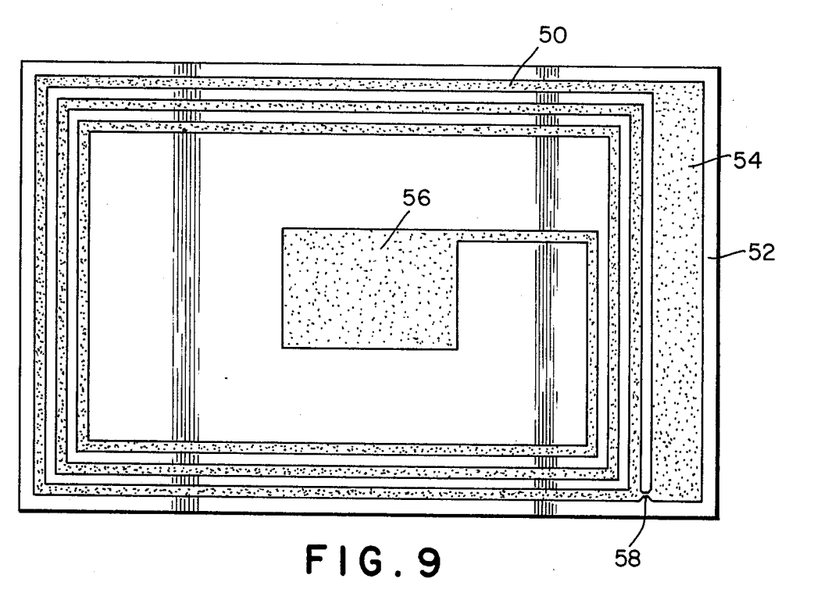
FIGS. 9 and 10 are pictorial representations of respective opposite sides of a single frequency planar tag circuit constructed according to the invention.
Figure 10:
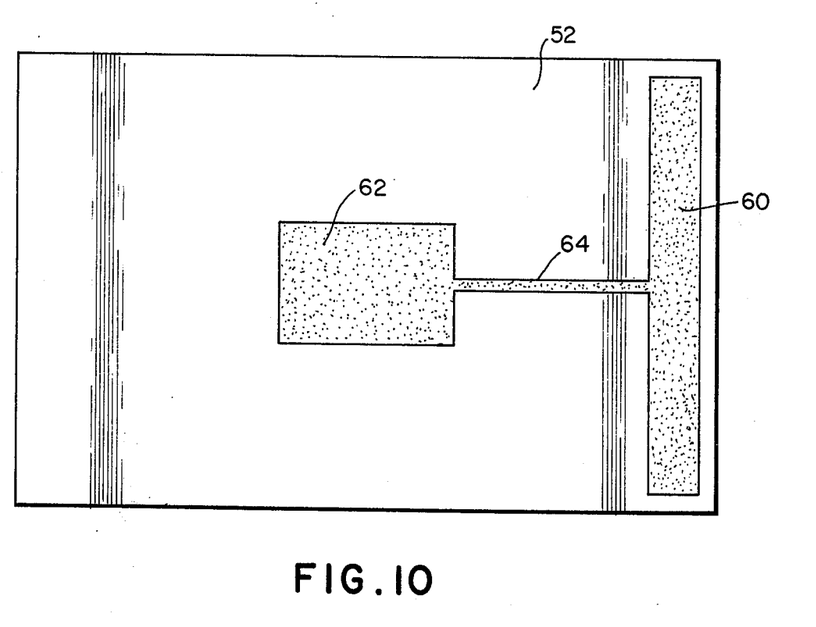
Figure 11:
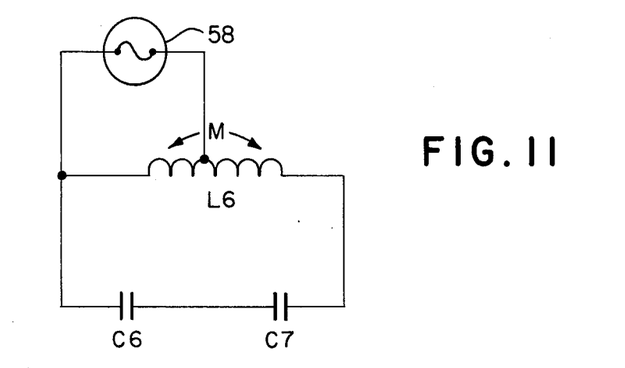
FIG. 11 is a schematic representation of the circuit of FIGS. 9 and 10.

An embodiment of the invention is shown in FIGS. 9 and 10, the schematic circuit of which is shown in FIG. 11 wherein a fusible link short circuits a portion of an inductor to provide a circuit having two resonant frequencies. Referring to FIG. 9 there is shown a conductive path 50 formed on a surface of a circuit board 52 and extending between a conductive area 54 disposed along one side of circuit board 52 and coupled at its inner end to a conductive area 56 disposed centrally of circuit board 52. A fusible link 58 interconnects conductive area 54 and a selected turn of path 50. The opposite surface of circuit board 52 includes conductive areas 60 and 62 in respective alignment with areas 54 and 56 on the opposite board surface and interconnected by a conductive path 64. The capacitor C1 is formed by conductive areas 56 and 62 while capacitor C2 is formed by conductive areas 54 and 60. The fusible link 58 short circuits a selected number of turns of inductor L. With link 58 unfused, the circuit of FIG. 11 resonates at a frequency determined by the inductor L6 within shorted connection and the associated capacitors. Link 58 can be fused upon application of suitable fusing current as described above and upon destruction of link 58 the circuit now exhibits a new resonant frequency determined by the full inductance of inductor L6 and the associated capacitors.

Figure 12:
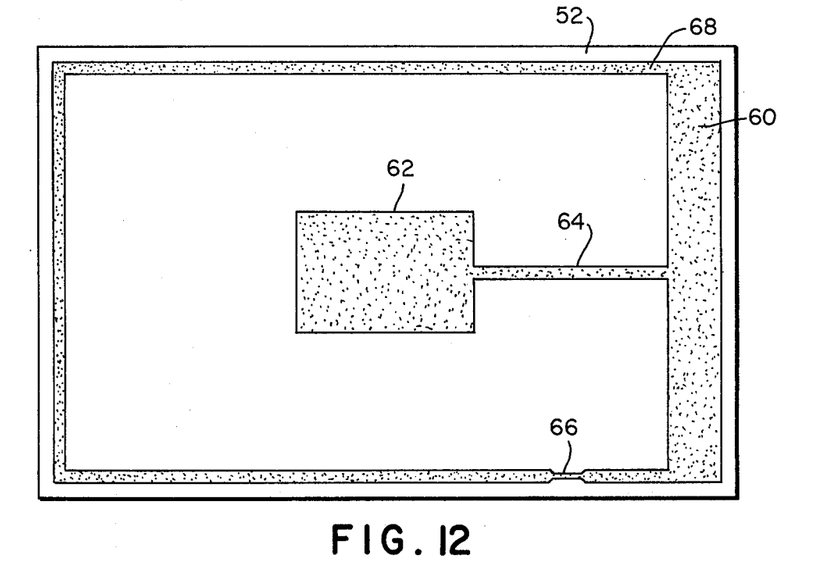
FIG. 12 is a pictorial representation of yet another embodiment of the invention.
Figure 13:
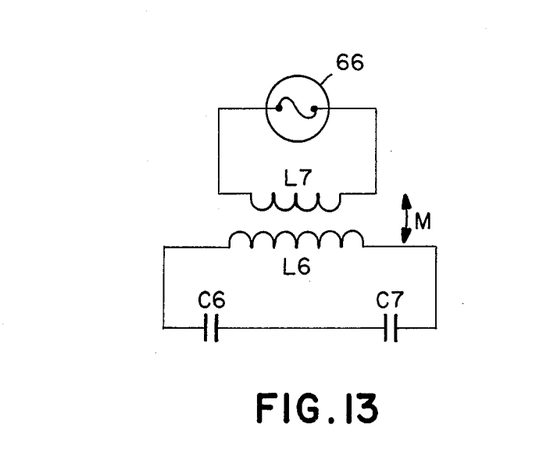
FIG. 13 is a schematic representation of the circuit of FIG. 12.

A modification of the circuit of FIG. 11 is shown in FIG. 13 wherein the fusible link 66 is in circuit with an inductor L7 provided on the opposite board surface to that of FIG. 11. In this modification, the fusible link 58 of the circuit of FIG. 11 is eliminated and is replaced by fusible link 66 formed within a conductive loop 68 interconnected between respective ends of area 60 as shown in FIG. 12. The loop 68 is in general alignment with loop 50 (FIG. 9) to provide mutual coupling therebetween.

Figure 14:
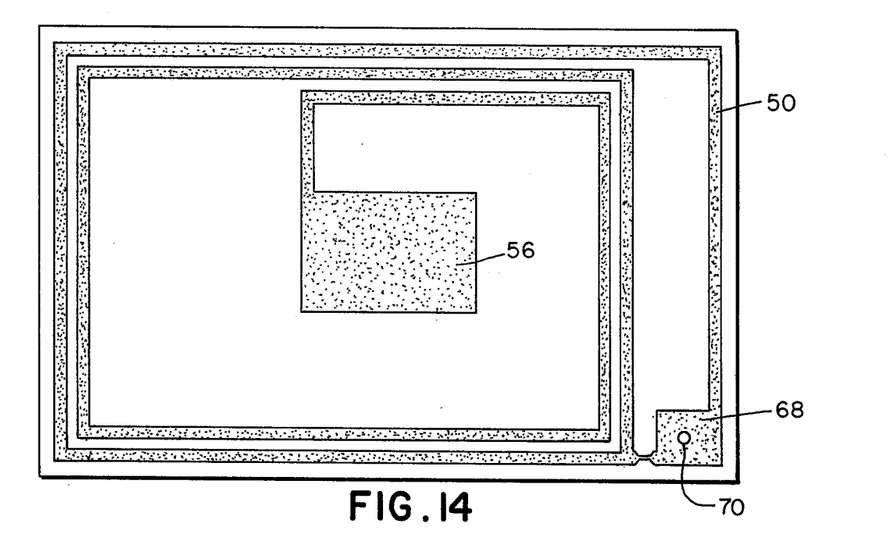
FIGS. 14 and 15 are pictorial representations of respective opposite sides of a further embodiment of the invention.
Figure 15:
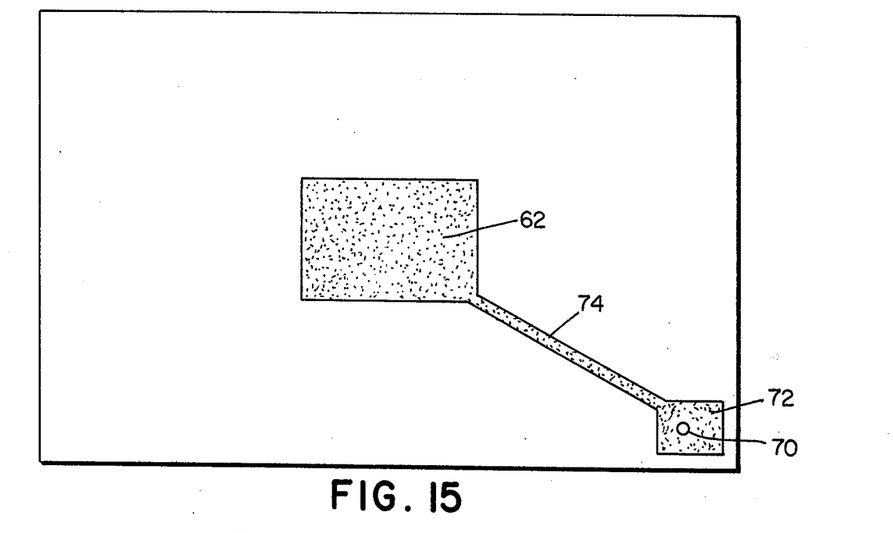
Figure 16:
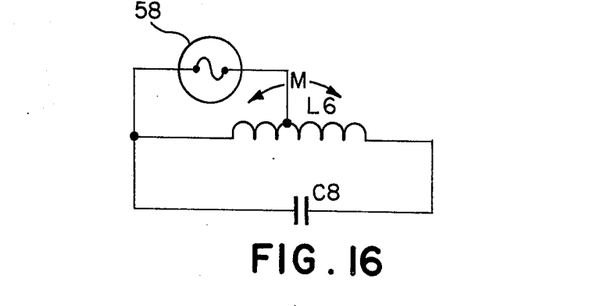
FIG. 16 is a schematic representation of the circuit of FIGS. 14 and 15.

It will be appreciated that the circuits of FIGS. 11 and 13 contain no ohmic connection between the circuit patterns formed on the respective board surfaces. The circuits can be alternatively formed with an ohmic interconnection to thereby eliminate one capacitor. For example, a modification of the circuit shown in FIG. 11 is depicted in FIG. 16 and is seen to be electrically equivalent to the circuit of FIG. 11 except that a single capacitor C8 has replaced the series capcitors C6 and C7. The circuit of FIG. 16 is fabricated in planar circuit form as shown in FIGS. 14 and 15. Referring to FIG. 14, the conductive pattern is seen to be substantially as in FIG. 9, except that loop 50 extends to a conductive area 68 which has replaced area 54. A conductive pin 70 or other ohmic interconnecton joins area 68 to a corresponding conductive area 72 on the opposite board surface, as shown in FIG. 15. The conductive area 72 is interconnected via a conductive path 74 to centrally disposed area 62 which is cooperative with conductive area 56 (FIG. 14) to form capacitor C8.

It will be appreciated that any of the circuit configurations described herein can be variously constructed with or without ohmic interconnection between respective circuit patterns formed on the two sides of the circuit board or with the fusible link in conductive interconnection with the associated circuit or inductively coupled thereto.

It will also be appreciated that various modifications and alternative implementations of the invention will occur to those versed in the art without departing from the true scope of the invention. Accordingly, it is not intended to limit the invention by what has been particularly shown and described except as indicated in the appended claims.

What is claimed is:
1. A multifrequency resonant tag circuit comprising:
   a planar substrate of eletrically insulative material;
   a first conductive path formed on a surface of said substrate in a configuration to define a first inductor;
   a second conductive path formed on said substrate in a configuration to define a second inductor;
   first and second pairs of conductive areas formed on said substrate, each pair having conductive areas in alignment on respective opposite surfaces of said substrate to define a capacitor, the conductive areas on each substrate surface being electrically connected to said paths on the common substrate surface at selected points to define first and second tuned circuits; and
   a conductive link having at least a portion of predetermined size, said link provided on a surface of said substrate in short circuit with at least a portion of one of said conductive paths and operative to fuse upon application of an energizing field to thereby alter the inductance of the associated conductive path and correspondingly alter the resonant properties of said tag circuit.

2. A resonant tag circuit according to claim 1 further including:
   a conductive path provided through said substrate and completing at least one of said tuned circuits by interconnection of said first or second conductive path and one of said conductive areas.

3. A resonant tag circuit according to claim 1 wherein said conductive link is provided as a planar path on the same surface of said substrate as said first and second conductive paths.

4. A resonant tag circuit according to claim 1 wherein said conductive link is formed as a planar conductive path on the surface of said substrate opposite to that containing said first and second conductive paths and in alignment with one of said first and second conductive paths to be in mutual coupling relationship therewith.

5. A resonant tag circuit according to claim 1 further including:

a conductive path of predetermined size provided in circuit with said tag circuit on a surface of said substrate and operative to fuse upon application of an energizing field at a second resonant frequency.

6. A resonant tag comprising:

a planar substrate of electrically insulative material;

a first conductive path formed on a surface of said substrate in a configuration to define an inductor;

at least one pair of conductive areas formed on said substrate in alignment on respective opposite surfaces of said substrate to define at least one capacitor, the conductive areas on the substrate surface containing said conductive path being electrically connected to said path at selected points to define a tuned circuit having a predetermined resonant frequency;

a conductive link of predetermined size provided on a surface of said substrate in short circuit with at least a portion of said conductive path and operative to fuse upon application of an energizing field to thereby alter the inductance of the associated conductive path and correspondingly alter the resonant properties of said tag circuit.

7. A resonant tag circuit according to claim 6 wherein said conductive link of predetermined size is provided on the surface of said substrate containing said conductive path.

8. A resonant tag circuit according to claim 6 wherein said conductive link of predetermined size is provided on a surface of said substrate opposite to the surface containing said conductive path and in alignment therewith to provide mutual coupling therebetween.

9. A multifrequency resonant tag circuit containing at least first and second tuned circuits respectively resonant at first and second frequencies comprising:

a planar substrate of electrically insulative material;

a first conductive path formed on a surface of said substrate in a configuration to define a first inductor;

a second condutive path formed on said substrate in a configuration to define a second inductor;

first and second pairs of conductive areas formed on said substrate each pair having conductive areas in alignment on respective opposite surfaces of said substrate to define a capacitor, the conductive areas on the substrate surface containing said first and second conductive paths being electrically connected to said paths at selected points to define said first and second tuned circuits;

a conductive path of predetermined size provided in circuit with said tag circuit on a surface of said substrate and operative to fuse upon application of electromagnetic energy at said second resonant frequency to thereby destroy the resonant properties of said tag circuit at said first frequency;

a conductive path of predetermined size provided in short circuit with at least a portion of one of said first and second conductive paths and operative to fuse upon application of electromagnetic energy at a third frequency to thereby render the tag circuit resonantly operative at said first and second frequencies; and a conductive path provided through said substrate and completing at least one of said tuned circuits by interconnection of said first or second conductive path and one of conductive areas.

10. A multifrequency resonant tag circuit containing at least first and second tuned circuits respectively resonant at said first and second frequencies comprising:

a planar insulative substrate having formed on one surface thereof a first conductive area centrally formed on said substrate surface;

a second conductive area formed along one side of said substrate surface;

a first conductive path arranged on said substrate surface between and in electrical connection with said first and second conductive areas;

a second conductive path formed on said substrate surface between and in electrical connection with said second conductive area and a third conductive area formed on said substrate surface near a corner thereof;

and wherein the opposite surface of said substrate includes:

fourth, fifth and sixth conductive areas each in alignment and substantially coextensive with said respective first, second and third conductive areas formed on said one substrate surface;

a conductive path connecting said fourth and fifth conductive areas;

a conductive path through said substrate connecting said third and sixth conductive areas;

a conductive path interconnecting said second and third conductive areas and dimensioned to fuse upon application of an electromagnetic field of predetermined power at a third frequency to thereby render said tag circuit operative at said first and second frequencies; and a conductive path interconnecting said fifth and sixth conductive areas and dimensioned to fuse upon application of an electromagnetic field of predetermined power at said second frequency to thereby destroy the resonant properties of said tag circuit at said first frequency.

11. A multifrequency resonant tag circuit containing at least first, second and third tuned circuits respectively resonant at first, second and third frequencies comprising:

a planar insulative substrate having formed on one surface thereof:

a first conductive area;

a second conductive area;

a first conductive path in electrical connection with said first and second conductive areas arranged in a configuration to define a first inductor;

a third conductive area;

a second conductive path in electrical connection with said second conductive area and said third conductive area and formed in a configuration to define a second inductor;

said planar insulative substrate having formed on a second surface thereof:

fourth, fifth and sixth conductive areas each in alignment and substantially coextensive with said respective first, second and third conductive areas formed on said one substrate surface, said first and fourth conductive areas and said second and fifth conductive areas comprising respective first and second capacitors;

a conductive path connecting said fourth and fifth conductive areas;

a conductive path through said substrate connecting said third and sixth conductive areas;
a conductive path interconnecting said second and third conductive areas to short circuit said first inductor and dimensioned to fuse upon application of an electromagnetic field of predetermined power at a third frequency to thereby render said tag circuit operative at said first and second frequencies; and
a conductive path interconnecting said fifth and sixth conductive areas and dimensioned to fuse upon application of an electromagnetic field of predetermined power at said second frequency to thereby destroy the resonant properties of said tag circuit at said first frequency;
said first inductor, second inductor and second capacitor being electrically connected to form said first tuned circuit; and
said first capacitor, second inductor and second capacitor being electrically connected to form said second tuned circuit;
said second inductor and second capacitor being electrically connected to form said third tuned circuit.

12. A multifrequency resonant tag circuit containing at least first, second and third tuned circuits respectively resonant at first, second and third frequencies comprising:
a planar insulative substrate having formed on one surface thereof:
a first conductive area;
a second conductive area;
a first conductive path in electrical connection with said first and second conductive areas arranged in a configuration to define a first inductor;
a third conductive area;
a second conductive path in electrical connection with said second conductive area and said third conductive area and formed in a configuration to define a second inductor;
said planar insulative substrate having formed on a second surface thereof:
fourth, fifth and sixth conductive areas each in alignment and substantially coextensive with said respective first, second and third conductive areas formed on said one substrate surface, said first and fourth conductive areas and said second and fifth conductive areas comprising respective first and second capacitors;
a conductive path connecting said fourth and fifth conductive areas;
a conductive path through said substrate connecting said third and sixth conductive areas;
a conductive path in closed circuit with said fifth area and in alignment with at least one of said first and second conductive paths and defining a third inductor mutually coupled to at least one of said first and second inductors and dimensioned to fuse upon application of an electromagnetic field of predetermined power at a third frequency to thereby render said tag circuit operative at said first and second frequencies; and
a conductive path interconnecting said fifth and sixth conductive areas and dimensioned to fuse upon application of an electromagnetic field of predetermined power at said second frequency to thereby destroy the resonant properties of said tag circuit at said first frequency;
said first inductor, second inductor and second capacitor being electrically connected to form said first tuned circuit; and
said first capacitor, second inductor and second capacitor being electrically connected to form said second tuned circuit;
said second inductor and second capacitor being electrically connected to form said third tuned circuit.

* * * * *